United States Patent
In et al.

(10) Patent No.: US 8,165,557 B1
(45) Date of Patent: Apr. 24, 2012

(54) FREQUENCY DOWN-CONVERSION SYSTEM USING ARRAYS OF COUPLED NON-LINEAR ELEMENTS

(75) Inventors: Visarath In, Chula Vista, CA (US); Patrick Longhini, San Diego, CA (US); Yong (Andy) An Kho, Chula Vista, CA (US); Joseph D. Neff, San Diego, CA (US); Suketu Naik, Kyoto (JP); Norman Liu, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 391 days.

(21) Appl. No.: 12/561,996

(22) Filed: Sep. 17, 2009

Related U.S. Application Data

(63) Continuation-in-part of application No. 11/755,601, filed on May 30, 2007, now Pat. No. 7,714,671, and a continuation-in-part of application No. 12/125,397, filed on May 22, 2008, now Pat. No. 7,777,535, and a continuation-in-part of application No. 12/391,508, filed on Feb. 24, 2009, now Pat. No. 7,902,931.

(51) Int. Cl.
 *H04B 1/26* (2006.01)
(52) U.S. Cl. ........ 455/323; 455/131; 455/207; 455/209; 455/255; 327/113; 327/117; 331/2; 331/45; 331/53
(58) Field of Classification Search .............. 455/131, 455/207, 209, 236.1, 255, 265, 314, 315, 455/318, 326, 323; 327/113, 117; 331/2, 331/45, 53
See application file for complete search history.

(56) References Cited

U.S. PATENT DOCUMENTS

| | | | | |
|---|---|---|---|---|
| 5,608,409 | A | * | 3/1997 | Rilling .......................... 342/380 |
| 7,242,327 | B1 | * | 7/2007 | Thompson ...................... 341/61 |

OTHER PUBLICATIONS

Visarath IN et al, "Exploiting dynamical symmetry in coupled non-linear elements for efficient frequency down-conversion", Physical Review E 76, pp. 026201-1 to 026201-6 (2007).

(Continued)

*Primary Examiner* — Tuan Pham
(74) *Attorney, Agent, or Firm* — Ryan J. Friedl; Kyle Eppele

(57) ABSTRACT

A system includes at least a first array connected to a second array. The first array includes an odd number, greater than one, of unidirectionally-coupled non-linear first array elements. The second array includes an odd number, greater than one, of unidirectionally-coupled non-linear second array elements. The second array elements are unidirectionally-coupled in a direction opposite the coupling direction of the second array elements. The first array is configured to receive an input signal and down-convert the input signal. The second array is configured to receive the down-converted input signal, further down-convert the down-converted input signal, and output a down-converted output signal. The down-converted output signal is down-converted to a multiple of the frequency of the input signal proportional to the number of arrays of the system. The system may operate at frequencies greater than 1 GHz and may be contained in a microchip or on a printed circuit board.

20 Claims, 13 Drawing Sheets

OTHER PUBLICATIONS

Visarath IN et al, "Complex dynamics in unidirectionally coupled overdamped bistable systems subject to a time-periodic external signal" Physical Review E 72, pp. 045104R-1 to 045104R-4 (2005).

Visarath IN et al, "Complex behavior in driven unidirectionally coupled overdamped Duffing elements" Physical Review E 73, pp. 066121-1 to 066121-9 (2006).

Visarath IN et al, "Coupling-induced oscillations in overdamped bistable systems", Physical Review E 68, pp. 045102R-1 to 045102R-9 (2003).

Visarath IN et al, "Emergent oscillations in unidirectionally coupled overdamped bistable systems" Physical Review E 70, 036103-1 to 036103-12 (2004).

* cited by examiner

US 8,165,557 B1

FREQUENCY DOWN-CONVERSION SYSTEM USING ARRAYS OF COUPLED NON-LINEAR ELEMENTS

CROSS-REFERENCES TO RELATED APPLICATIONS

This application is a continuation-in-part of commonly-assigned U.S. application Ser. No. 11/755,601, filed May 30, 2007, now U.S. Pat. No. 7,714,671 entitled "Wideband Non-Linear Channelizer for Rapid Processing of Static and Time-Varying Signals," commonly-assigned U.S. application Ser. No. 12/125,397, filed May 22, 2008, now U.S. Pat. No. 7,777,535 entitled "Coupled Non-Linear Elements for Frequency Down-Conversion Systems and Methods," and commonly-assigned U.S. application Ser. No. 12/391,508, filed Feb. 24, 2009, now U.S. Pat. No. 7,902,931 entitled "Wideband Non-Linear Circuits for Implementation in Frequency Channel Separation," the entire content each application fully incorporated by reference herein.

FEDERALLY SPONSORED RESEARCH AND DEVELOPMENT

The Frequency Down-Conversion System Using Arrays of Coupled Non-Linear Elements is assigned to the United States Government and is available for licensing for commercial purposes. Licensing and technical inquiries may be directed to the Office of Research and Technical Applications, Space and Naval Warfare Systems Center, Pacific, Code 2112, San Diego, Calif., 92152; voice (619) 553-2778; email ssc_pac_T2@navy.mil. Reference Navy Case No. 99771.

BACKGROUND

The process of generating new frequencies from an original oscillatory signal, either up-converting or down-converting the incoming signal, has been traditionally of interest in physics and engineering with applications that include: sensitive optical detection, music synthesis, acoustic and optical resonators, amplitude modulation, satellite communications, image extraction, and phase-noise measurements.

Frequency down-conversion is typically accomplished via a process known as heterodyning. Unfortunately, various heterodyning circuits can be inefficient and may raise the noise-floor of those devices implementing the heterodyning circuits. Accordingly, new approaches to frequency down-conversion are desirable.

DETAILED DESCRIPTION OF SOME EMBODIMENTS

Figure 1:
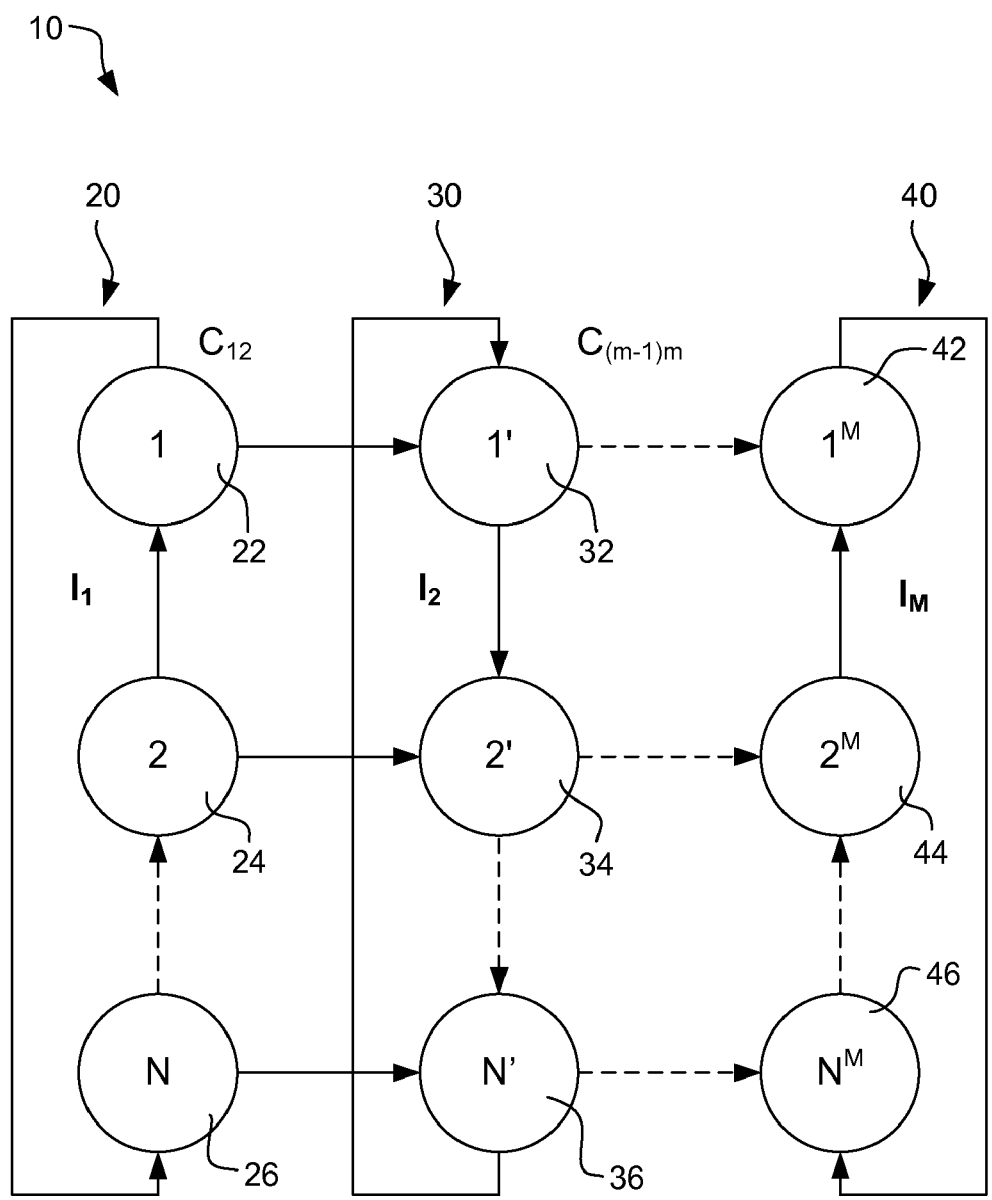
FIG. 1 shows a diagram of an embodiment of a system in accordance with the Frequency Down-Conversion System Using Arrays of Coupled Non-Linear Elements.

FIG. 1 shows a diagram of an embodiment of a system 10 in accordance with the Frequency Down-Conversion System Using Arrays of Coupled Non-Linear Elements. System 10 may include a first array 20, a second array 30 connected to first array 20, and an Mth array 40 connected to the M−1 array (the second array as shown), where M is an integer greater than two. Each array is coupled with a preferred direction, with the direction alternating from one array to the next. The symbol $\lambda_i$ represents the coupling strength within array i, while Cij represents the coupling strength from array i to array j.

First array 20 includes an odd number, greater than one, of unidirectionally-coupled non-linear first array elements 1 to N, such as elements 22, 24, and 26. First array 20 is configured to receive an input signal, such as input signal 330 of FIG. 3, and down-convert the input signal. Second array 30 includes an odd number, greater than one, of unidirectionally-coupled non-linear second array elements 1' to N', such as elements 32, 34, and 36. First array elements 22, 24, and 26 are unidirectionally coupled in a direction opposite the coupling direction of second array elements 32, 34, and 36. In embodiments of system 10 including a third array, the third array elements may be unidirectionally coupled in a direction opposite the coupling direction of second array elements 32, 34, and 36.

Figure 3:
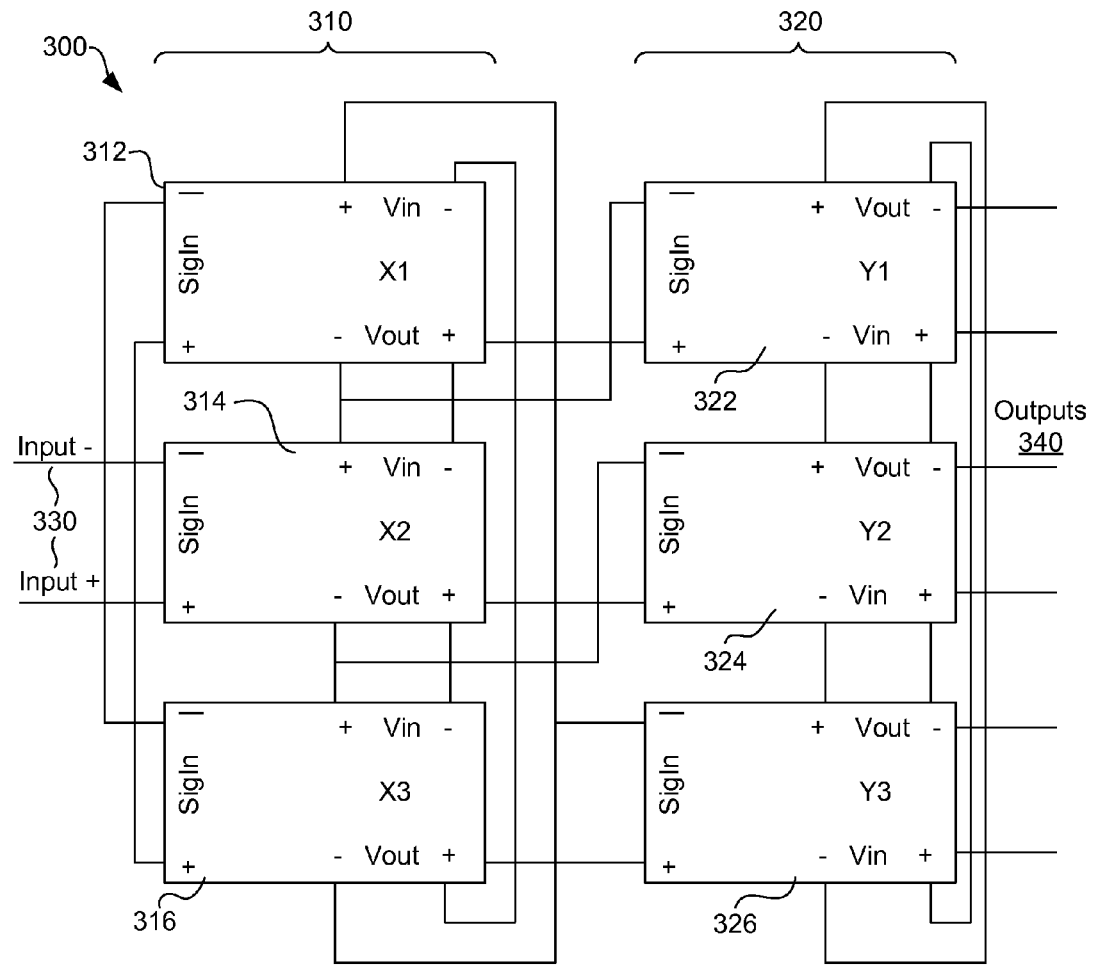
FIG. 3 shows a diagram of the microcircuit design of the system shown in FIG. 1 exhibiting two-array cascade.

Second array 30 is configured to receive the down-converted input signal from first array 20, further down-convert the down-converted input signal, and output a down-converted output signal, such as output signal 340 of FIG. 3. The down-converted output signal is down-converted to a multiple of the frequency of the input signal prescribed by the predicted multi-frequency pattern exhibited in the system of arrays in system 10 as shown in Table 1. For example, if system 10 includes 3 arrays, the down-converted output signal 340 of FIG. 3 is 1/75 the frequency of the input signal $((1/3)*(1/5)*(1/5))$.

The efficiency in lowering the frequency from one array to the next can be used in many applications which require shifting the frequency down from high to low for ease of digitizing the signal using an available analog-to-digital converter suitable for the task as used by many communication systems.

Table 1 shows down-conversion ratios between the frequency of the first array 20 (X array), ωx, and the frequency of the second array 30 (Y array), ωy, for a network of two coupled arrays interconnected as shown in FIG. 1, where k is a positive integer.

TABLE 1

| Number of Cells | ωx/ωy | | ... |
|---|---|---|---|
| 3 | 2 | 5 | 3k-1 |
| 5 | 4 | 9 | 5k-1 |
| 7 | 6 | 13 | 7k-1 |
| 9 | 8 | 17 | 9k-1 |
| N | N-1 | 2N-1 | Nk-1 |

Figure 2:
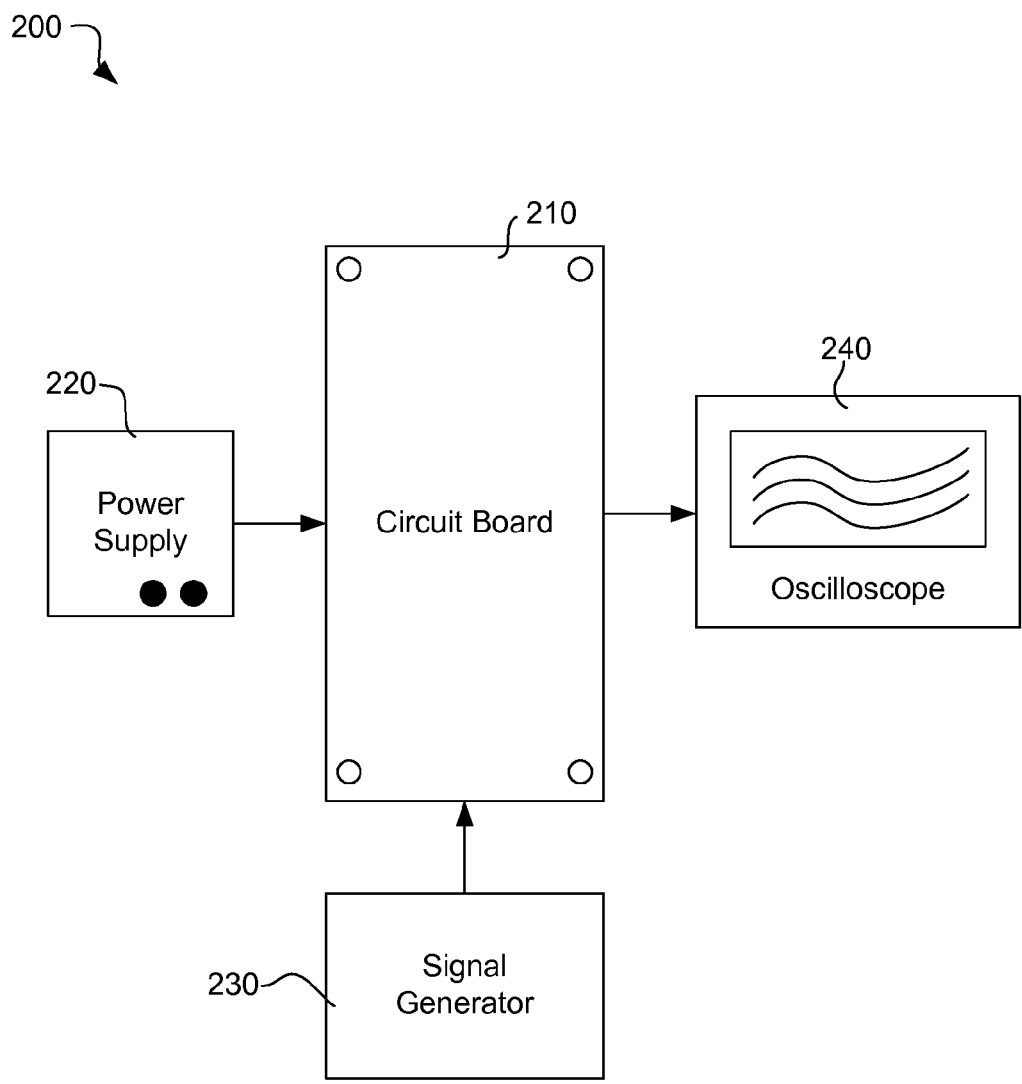
FIG. 2 shows a diagram of an embodiment of a microcircuit implementation of a system in accordance with the Frequency Down-Conversion System Using Arrays of Coupled Non-Linear Elements.

FIG. 2 shows a diagram of an embodiment of a microcircuit implementation of a system 200 in accordance with the Frequency Down-Conversion System Using Arrays of Coupled Non-Linear Elements. System 200 includes a circuit board 210, a power supply 220, a signal generator 230, and an oscilloscope 240. Circuit board 210 has the ability to apply an external signal to the first array, such as first array 20 of system 10. Such a setup may be used to further explore the down-conversion effect on the applied external signal, particularly the resonant effects between the natural frequency of oscillation of the individual arrays and that of the external signal. Each element in each array contained on circuit board 210 may be described by an over-damped, bi-stable system containing the hyperbolic tangent function as the nonlinear term given as $$\tau \dot{x} = -gx + I_s \tan h(c_s x). \quad \text{(Eq. 1)}$$

The dynamics of the entire system on circuit board 210, such as system 10, may be described by the following equations:

$$\tau \dot{x}_i = -gx_i + I_s \tan h(c_s x_i) + \tan h(c_c x_i + 1) + I_g \tan h(c_g \epsilon(t)) \quad \text{(Eq. 2)}$$

$$\tau \dot{y}_i = -gy_i + I_s \tan h(c_s y_i) + \tan h(c_c y_i + 1) + I_g \tan h(c_g x_i) \quad \text{(Eq. 3)}$$

where the entire dynamics are derived from Kirchoff's junction law of the circuit design and the $I_c$ and $c_c$ control the coupling strength inside the arrays, the $I_g$ and $c_g$ controls the gains of input signal in the X-array and the intra-array coupling in the Y-array, $\epsilon(t)$ is the input signal, mainly a time-dependent signal such as a frequency modulated (FM) signal. The parameters $c_s$, $c_c$, and $c_g$ are the intrinsic transistor parameters making up the operational transconductance amplifiers that may be used to build the non-linear part of the circuit and are not changeable once the microcircuit is designed and fabricated. In some embodiments, these parameters are determined to be the same ($c_s = c_c = c_g$) with a determined value of, for example, approximately 1/7 V.

As an example, the oscillation frequency of system 200 may be in the range of 240 MHz to 3.7 GHz, which is in the range of some RF applications. In the design of the frequency down-conversion system, $I_s$ controls depth of the bi-stability of the nonlinear oscillators, $I_c$ controls the coupling strength which resulted in changing the center frequency of the oscillation (channel center frequency), and $I_g$ controls the bandwidth of the channel of the frequency down-conversion system. If an input signal has a frequency difference from the center frequency that is greater than the bandwidth (channel width) of the system, the system will not be able to lock-on and down-convert the signal.

FIG. 3 shows a diagram of the microcircuit design of a system 300, such as system 10 shown in FIG. 1. Due to high frequency oscillations, system 300 may be designed on an integrated circuit board (as shown in FIG. 2) where impedance matching is necessary to apply the external signal into the bi-stable circuit of the first array 310 without affecting the second array 320. Inputs 330 are directed to elements 312, 314, and 316 of first array 310. The outputs of first array 310 are output to elements 322, 324, and 326 of second array 320. The outputs 340 of second array 320 may then be output to an electronic device such as an A/D converter.

Figure 4:
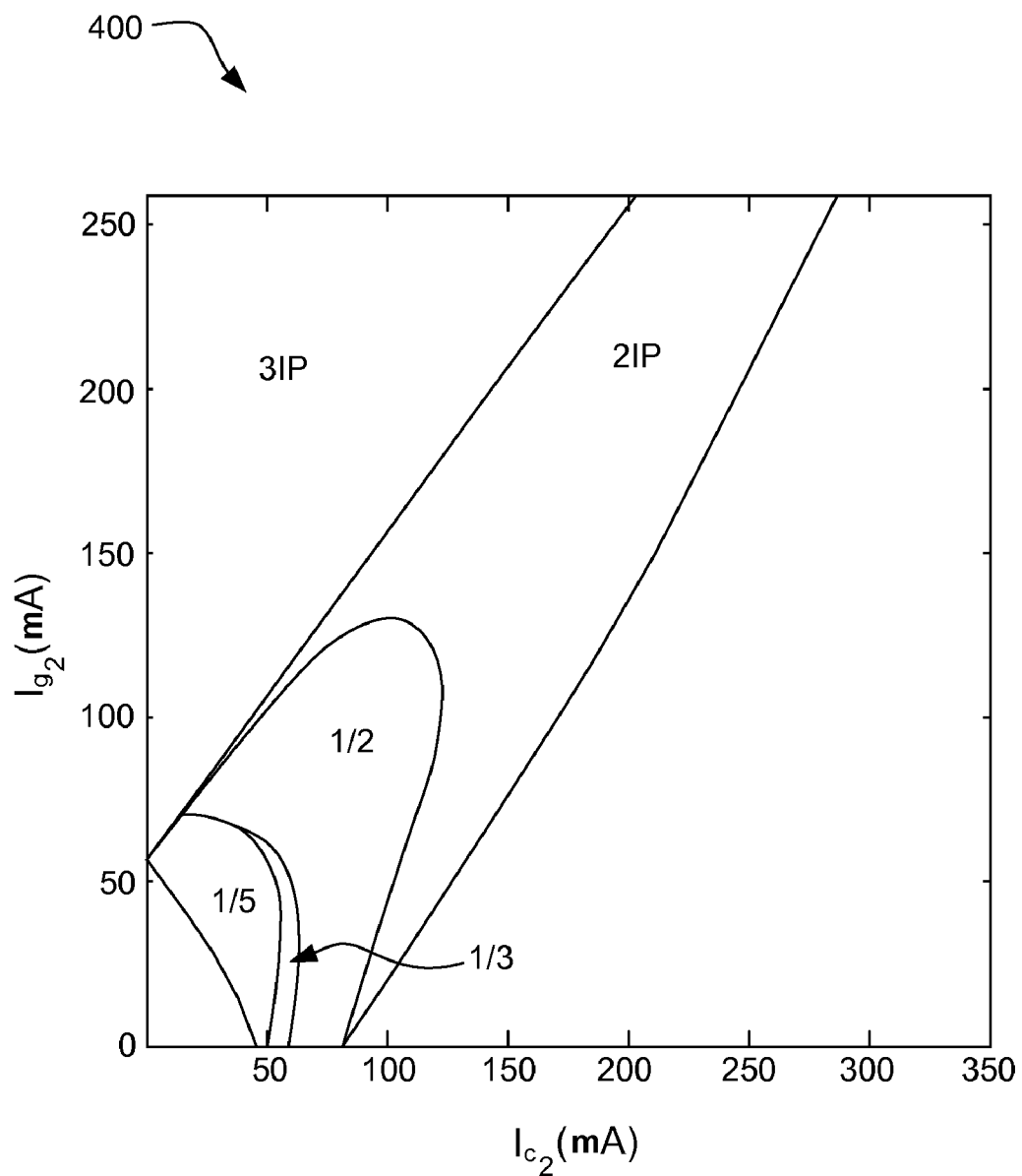
FIG. 4 shows a two parameter bifurcation diagram obtained numerically from an equation describing the system shown in FIG. 1.

FIG. 4 shows a two parameter bifurcation diagram 400 obtained numerically from an equation describing system 10 as shown in FIG. 1. FIG. 4 shows different regions of multi-frequency patterns in parameter space ($I_{g2}$, $I_{c2}$). Regions labeled 1/2, 1/3, and 1/5, correspond to the actual frequency down-conversion ratios between the voltage oscillations of two interconnected arrays of three oscillators per array. Region 2IP represents a pattern of oscillation where two units of each array are phase-locked with the same amplitude with the third unit being out-of-phase by π. Region 3IP represents full entrainment, frequency and phase locking of voltage oscillations between corresponding oscillatory units of each array. Fixed parameters are: τ=0.285 pF, g=0.002 Siemens, $c_s = c_c = c_g = 1/7$ V, $I_c = 195$ μA and $I_s = 384$ μA for both the X and Y arrays, $I_g = 95$ μA for the X-array, and $I_{g2}$ and $I_{c2}$ are the sweep parameters for $I_g$ and $I_c$, respectively, in the Y array.

Figure 5:
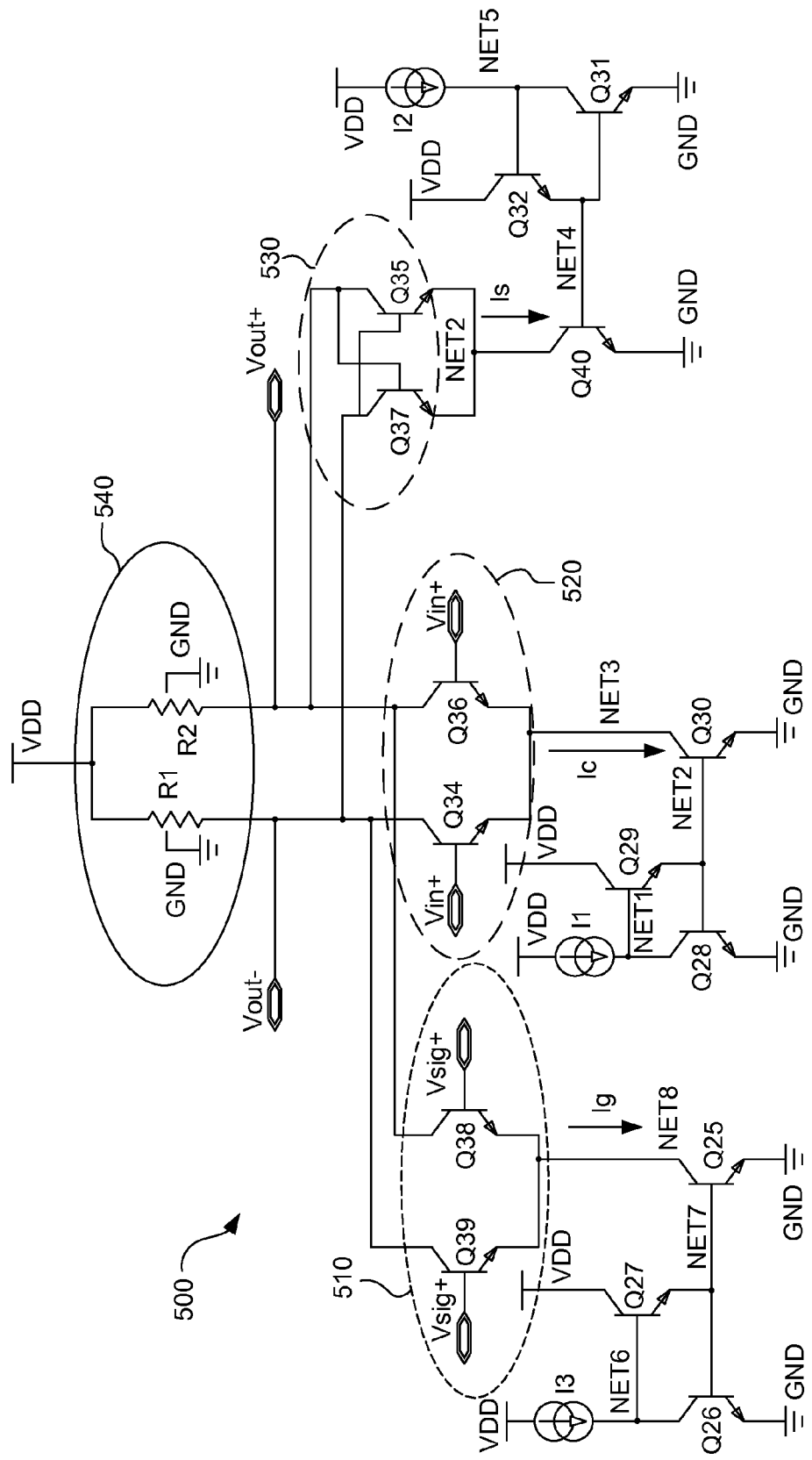
FIG. 5 shows a detailed bifurcation diagram of an embodiment of an oscillatory element 500 of the microcircuit shown in FIGS. 2 and 3.

FIG. 5 shows a detailed diagram of an embodiment of an oscillatory element 500 of the microcircuit shown in FIGS. 2 and 3. Element 500 may include an input signal operational transconductance amplifier (OTA) 510, a coupling OTA 520, a non-linear OTA 530, and a resistive load 540. Each element 500 may have fully differential inputs and outputs for better common-mode noise immunity.

A system, such as system 300, using such a configuration of element 500, may be set so that the receiving array, first array 310, oscillates at about 365 MHz, and the second array, array 320, is in a region of locking on to 1/5th of that frequency with the proper setting of the system parameters τ, g, $I_s$, $I_c$, and $I_g$. To aid in setting up the correct parameters that lead to the first array oscillating out-of-phase and the second array oscillating at one-fifth of that frequency, a model of the experiment may be simulated in a SPICE program. Once those parameters are determined and set, the behavior is readily established when powering the circuit.

A down-converter board, such as that shown in FIG. 2, may be powered with a 3.3V power supply, with $I_c$, $I_s$, and $I_g$ set by adjusting potentiometers and measured directly with a multi-meter. The values of $I_c$ and $I_s$ may be set to 195 μA and 384 μA, respectively, on both the first and second arrays. On the first array, $I_g$ may be set to 96 μA, and on the second array it may be set to 60.2 μA. The value of τ may be set by the total node parasitic capacitance, $C_L$, of 0.1 pF, and the g may be set to 0.002 Siemens.

Figure 6:
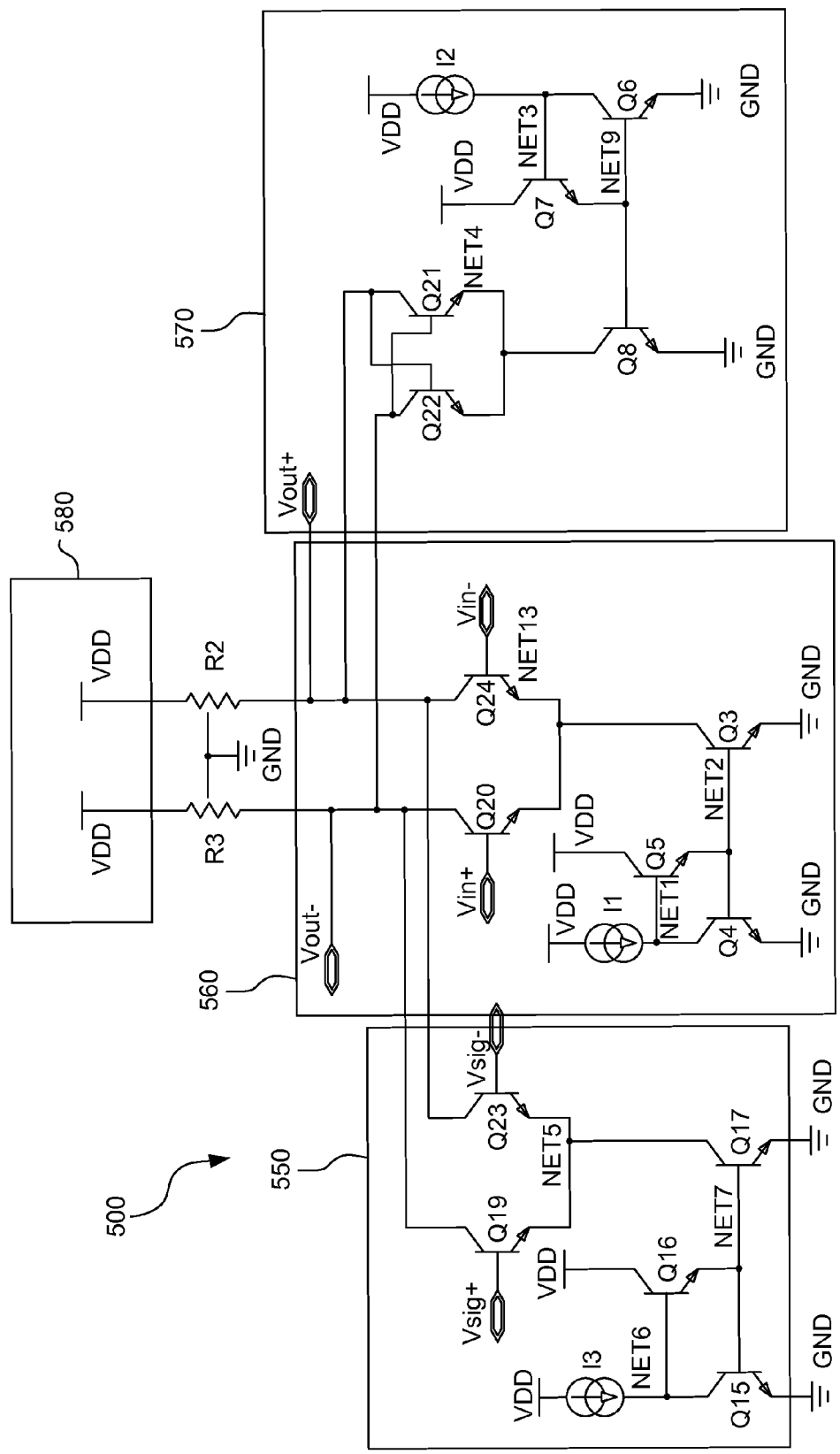
FIG. 6 shows a detailed diagram of oscillatory element 500 of FIG. 5, with sections pertaining to the system equation components.

FIG. 6 shows a detailed diagram of oscillatory element 500 of FIG. 5, with sections pertaining to the system equation components. As shown, element 500 is divided into section 550 which is described by the equation $2I_g \tan h(cVsig)$, section 560 which is described by the equation $2I_c \tan h(cV_i - 1)$, and section 570 which is described by the equation $2I_s \tan h(cV_i)$. Element 500 also includes section 580, which may be described by the equation $-V_i/R$. The total system may be described by the function $$C_L * \dot{V}_i = -gV_i + I_c \tan h(c_c * V_{i-1}) + I_s \tan h(c_s * V_i) + I_g \tan h(c_c * V_{sig}) \quad \text{(Eq. 4)}$$

where $C_L$ is the total parasitic capacitance at the output node of the i-th element, $V_i$ is the differential output of the i-th element, $V_{sig}$ is the differential input signal, g is the linear conductance, $c_c$, $c_s$, and $c_g$ are intrinsic transistor parameters, and $I_c$, $I_s$, and $I_g$ are bias currents.

Figure 7:
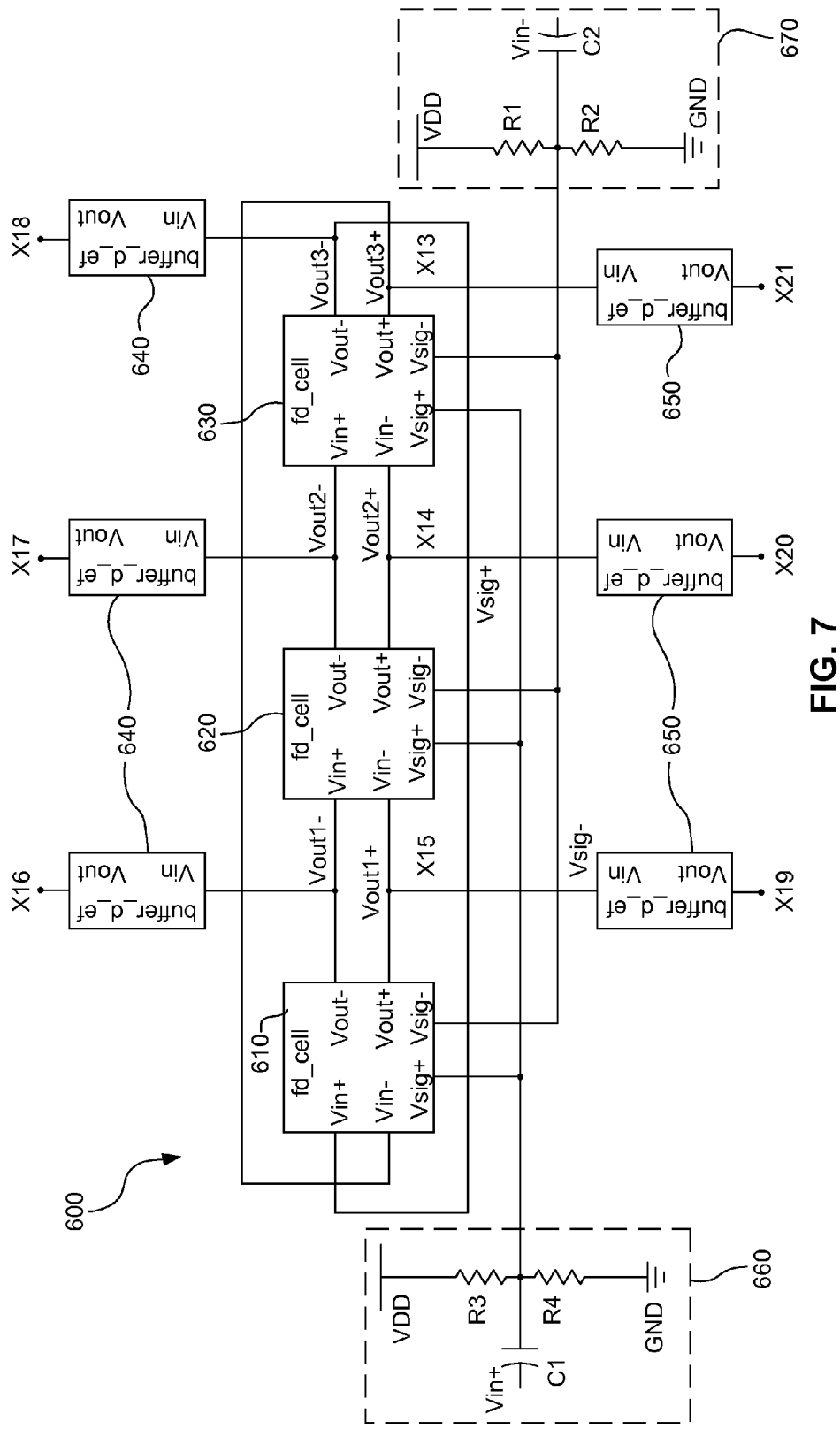
FIG. 7 shows a schematic diagram of a three-element ring for a system 600 in accordance with the Frequency Down-Conversion System Using Arrays of Coupled Non-Linear Elements.
Figure 8A:
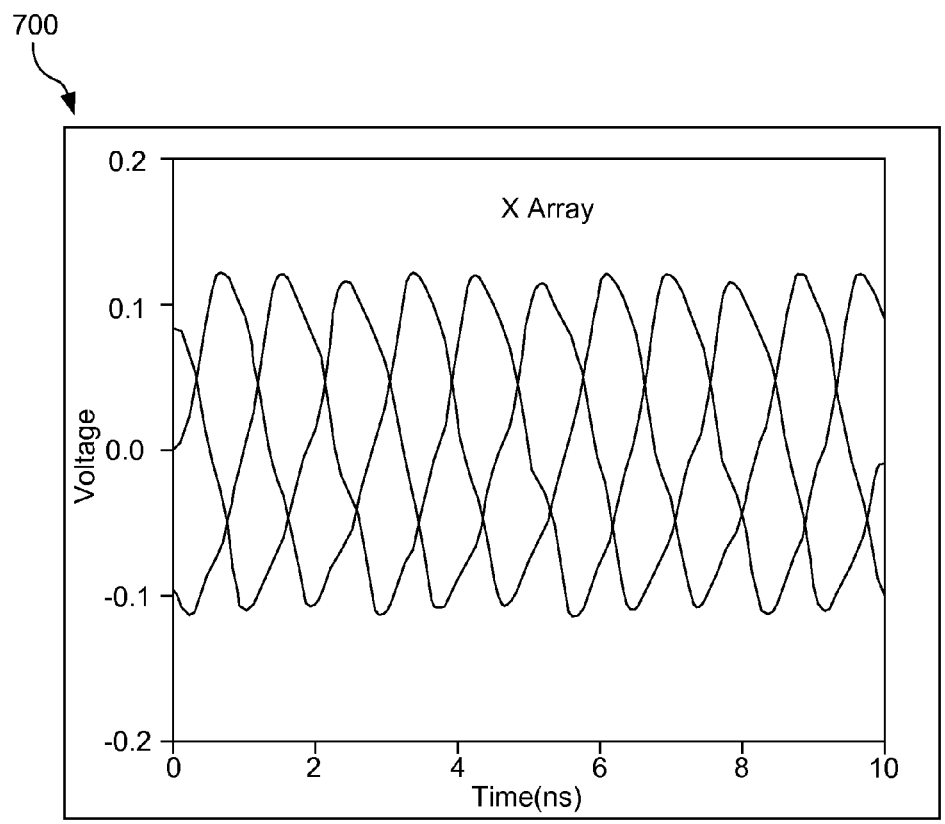
FIG. 8 shows graphical depictions of voltage measurements of the electronic microcircuit implementation as shown in FIG. 2.
Figure 8B:
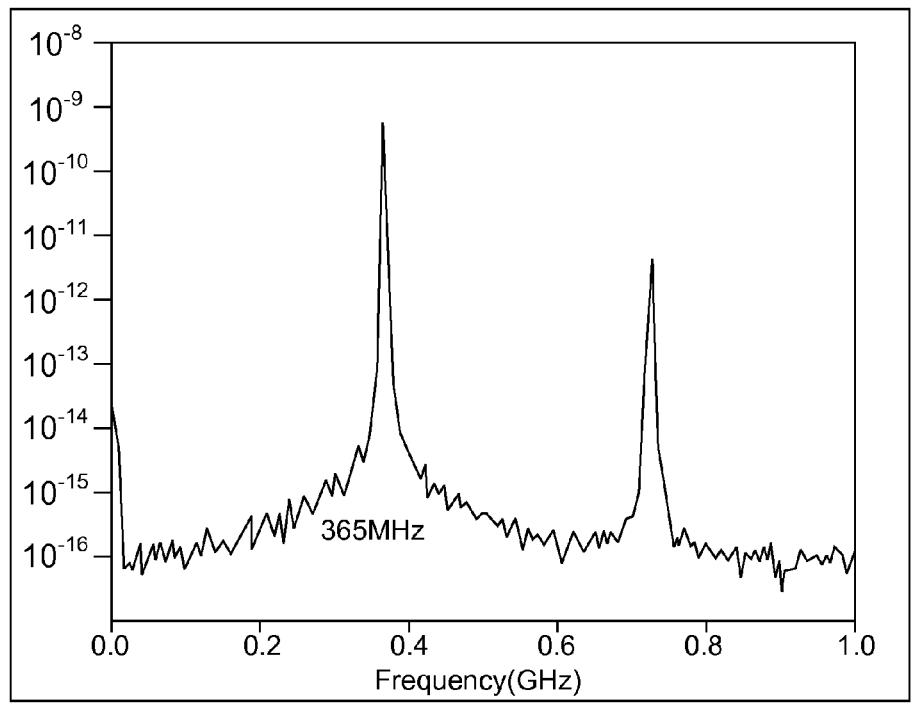
Figure 8C:
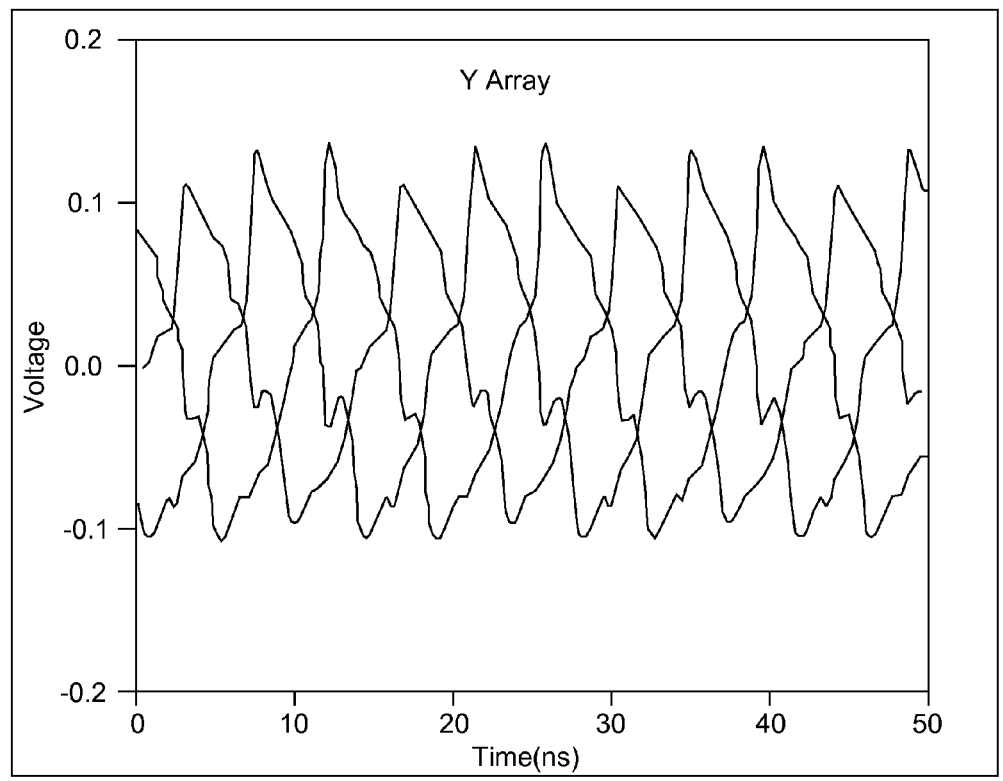
Figure 8D:
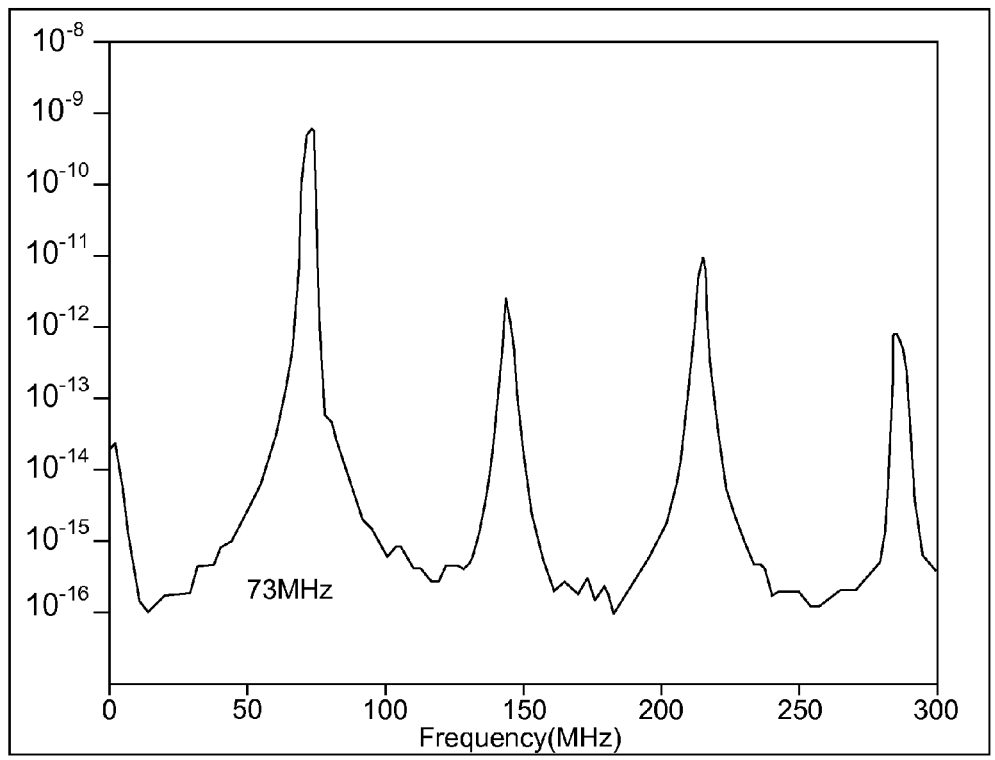

FIG. 7 shows a schematic diagram of a three-element ring for a system 600 in accordance with the Frequency Down-Conversion System Using Arrays of Coupled Non-Linear Elements. System 600 may include coupled elements 610, 620, and 630, on-chip buffers 640 and 650, and off-chip biasing circuits 660 and 670 for generating the differential biasing currents for the input signal. This is to create a controllable $I_g$ biasing current so that the appropriate value may be set to a particular value for the channel configuration, i.e. setting the bandwidth of the channel.

FIG. 8 shows graphical depictions of voltage measurements of the electronic microcircuit implementation as shown in FIG. 2. FIG. 8 shows the resulting time series of the first array (left column) and the time series of the second array (right column) along with their associated power spectral density plots in the lower figures. As shown, each individual array is oscillating in a traveling wave pattern with a phase lag of $2\pi/3$. The voltage in the first array oscillates at 365 MHz and the voltage in the second array oscillates at approximately one-fifth of the oscillation frequency of the first array.

Figure 9:
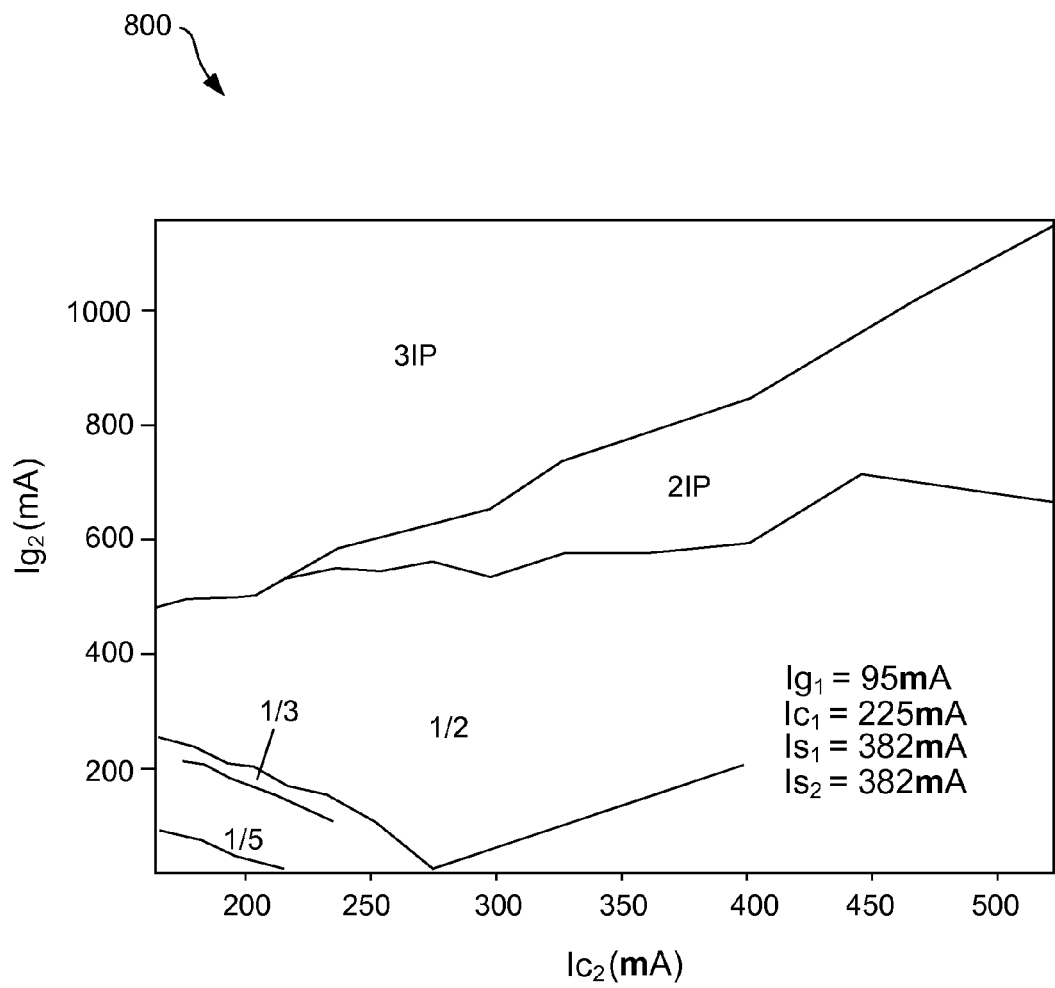
FIG. 9 shows a two parameter bifurcation diagram obtained from the electronic microcircuit implementation as shown in FIG. 2.
Figure 10A:
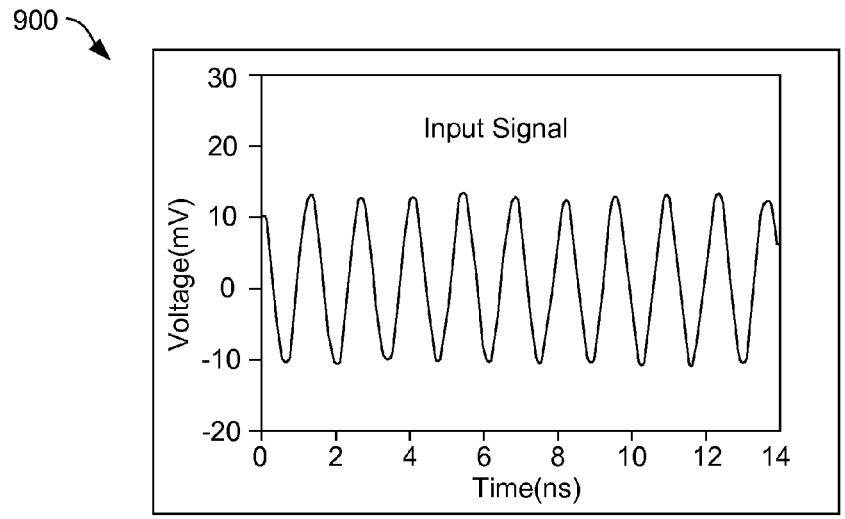
FIG. 10 shows graphical depictions of voltage measurements and power spectral densities of the electronic microcircuit implementation as shown in FIG. 2, modeling the system shown in FIG. 1, subject to an externally applied signal.
Figure 10B:
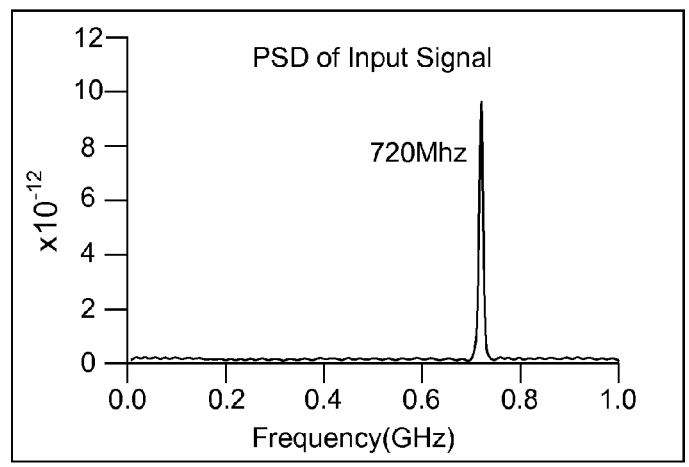
Figure 10C:
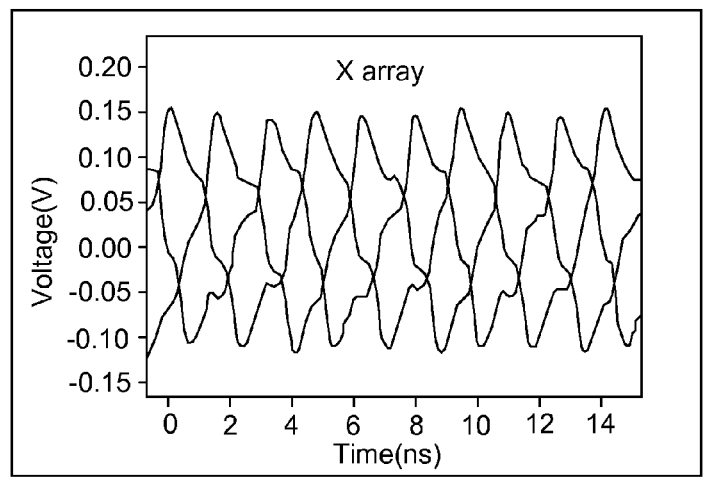
Figure 10D:
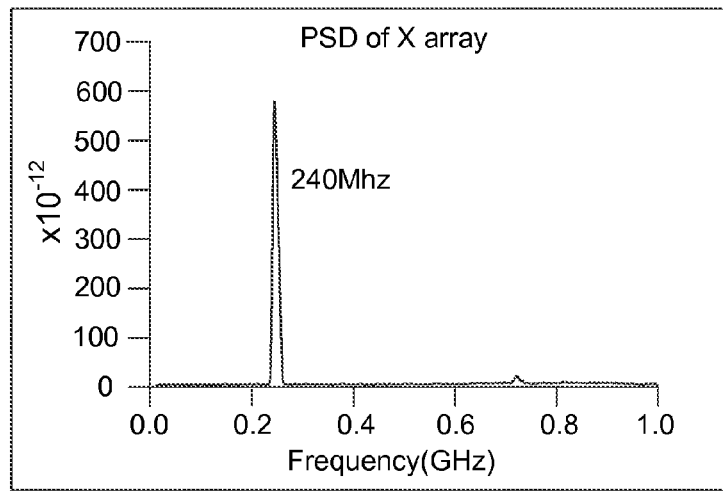
Figure 10E:
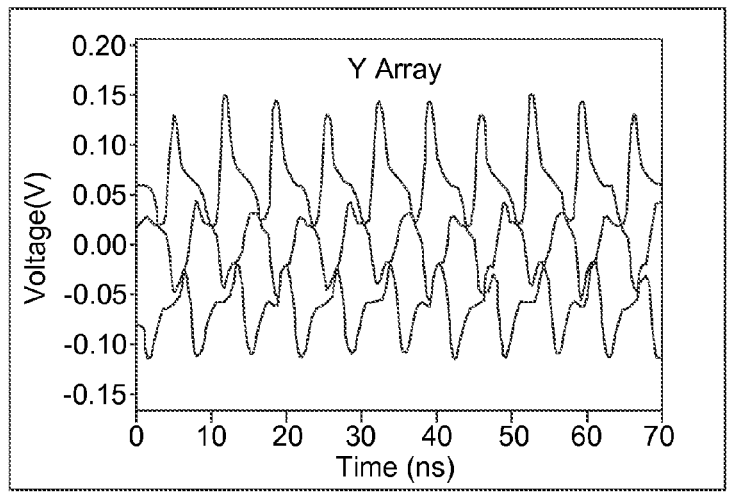
Figure 10F:
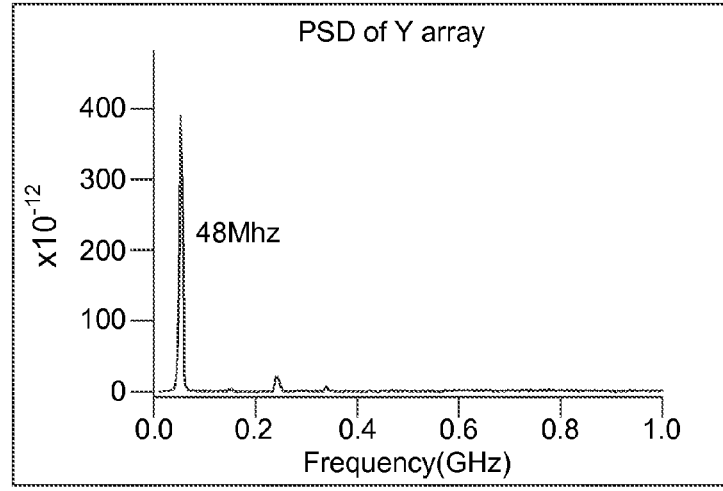

FIG. 9 shows a two parameter bifurcation diagram obtained from the electronic microcircuit implementation as shown in FIG. 2. FIG. 9 depicts the boundaries of several multi-frequency patterns in parameter space ($I_g$, $I_c$). Regions labeled 1/2, 1/3, 1/5, 2IP, and 3IP, represent actual frequency down-conversion ratios between the voltage oscillations of two interconnected arrays of three oscillators per array. Region 2IP represents a pattern of oscillation where two units of each array are phase-locked with the same amplitude with the third unit being out-of-phase by $\pi$. Region 3IP represents full entrainment, frequency and phase locking of voltage oscillations between corresponding oscillatory units of each array.

When an input signal is applied to the first array, such as array 310 of system 300, with amplitude of 0.0244V peak-to-peak, first array 310 responds by locking onto that signal at 1/3 of the frequency of the incoming signal, while the oscillations of the subunits in the first array are still out-of-phase with each other by $2\pi/3$ degrees, or $2\pi/N$ for larger arrays. For N elements in the array, the phase difference between each element is $2\pi/N$ and the frequency of each element is $1/N$ of the input signal. Since the first array down-converts the input signal's frequency by 1/3 (for N=3) and the second array down-converts the output of the first array by a factor of 1/5, the combined effect of the signal passing through the two coupled arrays is a down-conversion factor of 1/15.

FIG. 10 shows graphical depictions of voltage measurements and power spectral densities of the electronic microcircuit implementation as shown in FIG. 2, modeling the system shown in FIG. 1, subject to an externally applied signal. When the external signal is applied to the first array, the first array responds by locking its voltage oscillations to 1/3 of the frequency of the incoming signal, which is 720 MHz. Since the two-array network is operating in a region with frequency down-conversion ratio of 1/5, the combined effect on the signal as it passes through the second array is a down-conversion ratio by factor 1/15. Powers spectral density plots in the right column validate the 1/15 ratio comparing the top and the bottom figures.

Figure 11:
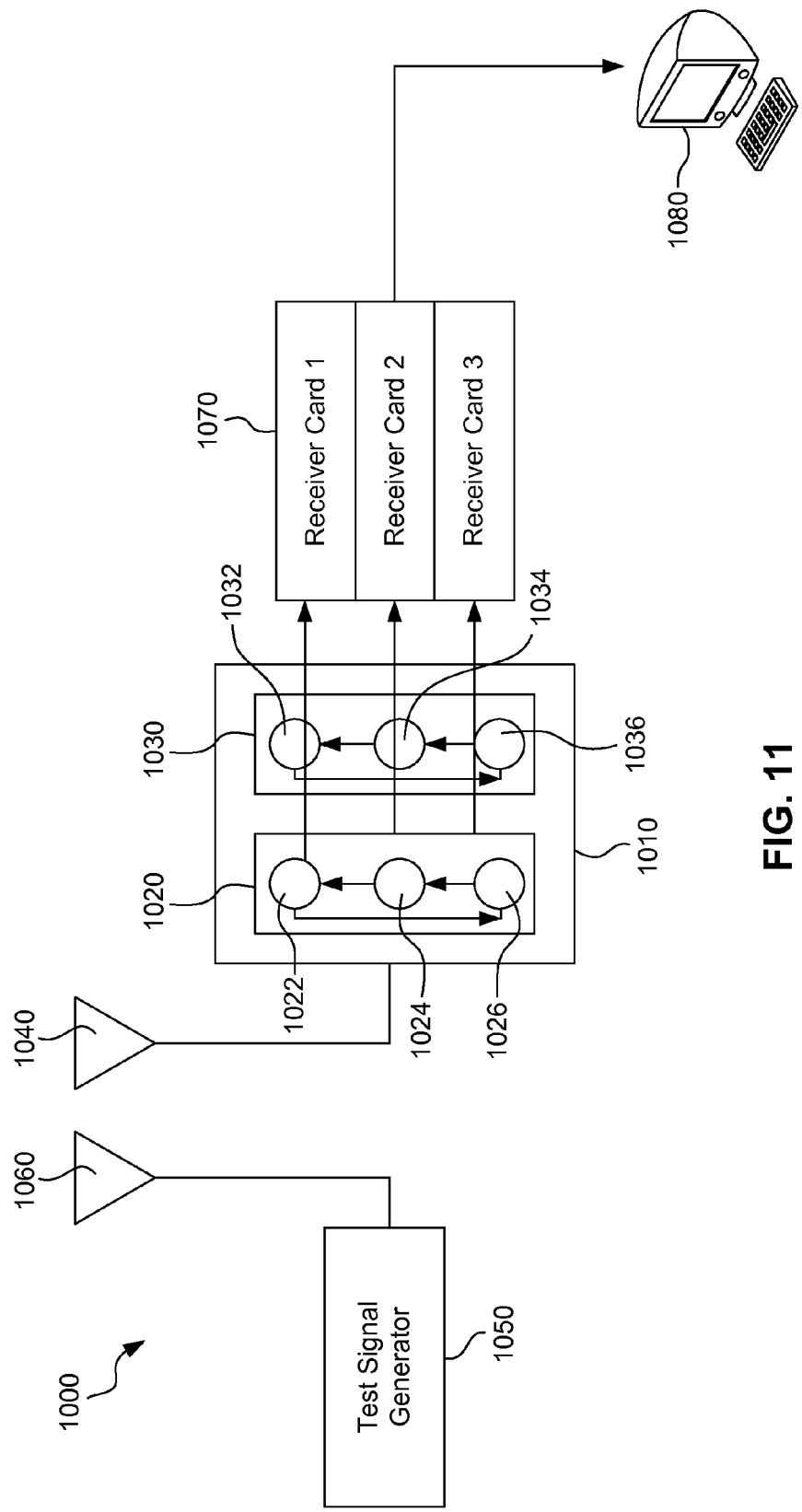
FIG. 11 shows a diagram of an embodiment of the hardware configuration of a system in accordance with the Frequency Down-Conversion System Using Arrays of Coupled Non-Linear Elements.

FIG. 11 shows a diagram of an embodiment of the hardware configuration of a system 1000 in accordance with the Frequency Down-Conversion System Using Arrays of Coupled Non-Linear Elements. System 1000 may be used as a wireless test configuration for the concepts disclosed herein. System 1000 may include a frequency down-conversion unit 1010 having a first array 1020 with elements 1022, 1024, and 1026, and a second array 1030 with elements 1032, 1034, and 1036.

Unit 1010 may be connected to antenna 1040, which receives test signals from a test signal generator 1050 via antenna 1060. Examples of test signals that can be used include both narrowband signals and wideband signals. Examples of narrowband signals include analog signals such as AM or FM, and digital signals such as BPSK, QPSK, ASK, and QAM. Examples of wideband signals include CDMA, GPS, and Bluetooth signals.

After unit 1010 receives and down-converts the test signals, they are output to analog-to-digital converter cards 1070 that provide A/D conversion and an interface to a computing device for signal processing. As an example, A/D cards 1070 may be model NI-PXIe-5663, manufactured by the National Instruments Corporation. A/D cards 1070 may be connected to computer 1080, which may be configured with software to perform time-interleaving, demodulation, and analysis of the captured signals.

Many modifications and variations of the Frequency Down-Conversion System Using Arrays of Coupled Non-Linear Elements are possible in light of the above description. Within the scope of the appended claims, the embodiments of the systems described herein may be practiced otherwise than as specifically described. The scope of the claims is not limited to the implementations and embodiments disclosed herein, but extends to other implementations and embodiments as may be contemplated by those having ordinary skill in the art.

We claim:

1. A system comprising:
a first array comprising an odd number, greater than one, of unidirectionally-coupled non-linear first array elements, the first array configured to receive an input signal and down-convert the input signal; and
a second array, connected to the first array, comprising an odd number, greater than one, of unidirectionally-coupled non-linear second array elements, the second array configured to receive the down-converted input signal, further down-convert the down-converted input signal, and output a down-converted output signal.

2. The system of claim 1, wherein each of the first array elements and the second array elements comprise an input signal operational transconductance amplifier (OTA), a coupling OTA, and a non-linear OTA.

3. The system of claim 2, wherein each of the first array elements and the second array elements are described by the function $$C_L * \dot{V}_i = -gV_i + I_c \tan h(c_c * V_{i-1}) + I_s \tan h(c_s * V_i) + I_g \tan h(c_c * V_{sig}),$$

where $C_L$ is the total parasitic capacitance at the output node of the i-th element, $V_i$ is the differential output of the i-th element, $V_{sig}$ is the differential input signal, g is the linear conductance, $c_c$, $c_s$, and $c_g$ are intrinsic transistor parameters, and $I_c$, $I_s$, and $I_g$ are bias currents.

4. The system of claim 1 further comprising a power supply connected to the first array and the second array.

5. The system of claim 1, wherein the first array and the second array operate at a frequency greater than or equal to 1 GHz.

6. The system of claim 1, wherein each of the first array elements and the second array elements comprise fully differential inputs and outputs.

7. The system of claim 1, wherein the first array elements are unidirectionally-coupled in a direction opposite the coupling direction of the second array elements.

8. The system of claim 1 further comprising at least a third array, connected to the second array, comprising an odd number, greater than one, of third array elements unidirectionally-coupled in a direction opposite the coupling direction of the second array elements.

9. The system of claim 1, wherein the down-converted output signal is down-converted to a multiple of the frequency of the input signal proportional to the number of arrays of the system.

10. The system of claim 1, wherein the first array and the second array are formed on a printed circuit board.

11. The system of claim 1, wherein the first array and the second array are contained in a microchip.

12. A system comprising:
   a first array comprising an odd number, greater than one, of unidirectionally-coupled non-linear first array elements; and
   a second array, connected to the first array, comprising an odd number, greater than one, of unidirectionally-coupled non-linear second array elements, the second array elements unidirectionally-coupled in a direction opposite the coupling direction of the second array elements
   wherein each of the first array elements and the second array elements comprise an input signal operational transconductance amplifier (OTA), a coupling OTA, and a non-linear OTA.

13. The system of claim 12, wherein each of the first array elements and the second array elements are described by the function $$C_L * \dot{V}_i = -gV_i + I_c \tan h(c_c * V_{i-1}) + I_s \tan h(c_s * V_i) + I_g \tan h(c_c * V_{sig}),$$

where $C_L$ is the total parasitic capacitance at the output node of the i-th element, $V_i$ is the differential output of the i-th element, $V_{sig}$ is the differential input signal, g is the linear conductance, $c_c$, $c_s$, and $c_g$ are intrinsic transistor parameters, and $I_c$, $I_s$, and $I_g$ are bias currents.

14. The system of claim 12 further comprising a power supply connected to the first array and the second array.

15. The system of claim 12, wherein the first array and the second array operate at a frequency greater than or equal to 1 GHz.

16. The system of claim 12, wherein each of the first array elements and the second array elements comprise fully differential inputs and outputs.

17. The system of claim 12 further comprising at least a third array, connected to the second array, comprising an odd number, greater than one, of third array elements unidirectionally-coupled in a direction opposite the coupling direction of the second array elements.

18. The system of claim 12, wherein the down-converted output signal is down-converted to a multiple of the frequency of the input signal proportional to the number of arrays of the system.

19. The system of claim 12, wherein the first array and the second array are contained in a microchip.

20. A system comprising:
   a first array comprising an odd number, greater than one, of unidirectionally-coupled non-linear first array elements; and
   a second array, connected to the first array, comprising an odd number, greater than one, of unidirectionally-coupled non-linear second array elements, the second array elements unidirectionally-coupled in a direction opposite the coupling direction of the second array elements
   wherein first array elements and the second array elements are described by the function $C_L * \dot{V}_i = -gV_i + I_c \tan h(c_c * V_{i-1}) + I_s \tan h(c_s * V_i) + I_g \tan h(c_c * V_{sig})$, where $C_L$ is the total parasitic capacitance at the output node of the i-th element, $V_i$ is the differential output of the i-th element, $V_{sig}$ is the differential input signal, g is the linear conductance, $c_c$, $c_s$, and $c_g$ are intrinsic transistor parameters, and $I_c$, $I_s$, and $I_g$ are bias currents.

* * * * *